United States Patent
Nozuyama

(10) Patent No.: US 7,283,918 B2
(45) Date of Patent: Oct. 16, 2007

(54) APPARATUS FOR ANALYZING FAULT OF SEMICONDUCTOR INTEGRATED CIRCUIT, METHOD FOR THE SAME, AND COMPUTER READABLE MEDIUM FOR THE SAME

(75) Inventor: Yasuyuki Nozuyama, Inashiro (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 11/484,857

(22) Filed: Jul. 12, 2006

(65) Prior Publication Data
US 2007/0013403 A1    Jan. 18, 2007

(30) Foreign Application Priority Data
Jul. 12, 2005    (JP)    ............................ P2005-202979

(51) Int. Cl.
G01R 31/00    (2006.01)
G01R 31/26    (2006.01)

(52) U.S. Cl. .................. 702/117; 702/108; 324/765

(58) Field of Classification Search ................ 702/108, 702/117, 118, 183, 184, 185, 189, 190; 324/763, 324/764, 765; 438/16
See application file for complete search history.

(56) References Cited

U.S. PATENT DOCUMENTS 6,522,159 B1    2/2003    Nishide 7,096,140 B2 *    8/2006    Nozuyama et al. ......... 702/117
2004/0004493 A1 *    1/2004    Furukawa ................... 324/765

FOREIGN PATENT DOCUMENTS

JP    09-292444    11/1997
JP    10-019986    1/1998

OTHER PUBLICATIONS

"Decouple: Defect Current Detection in Deep Submicron IDDQ", Proc. IEEE International Test Conference, pp. 199-206, 2000; Y.Okuda; Oct. 2000.

* cited by examiner

Primary Examiner—Bryan Bui
(74) Attorney, Agent, or Firm—Banner & Witcoff, Ltd

(57) ABSTRACT

A fault on a measuring point and information about a driving circuit of the fault are extracted. A signal value of a portion related to the fault on the measuring point and an input value of the driving circuit of the portion are obtained when a fault is not included. A fault candidate is extracted from detected faults based on a difference between a measured IDDQ value and a measured estimated IDDQ value when the fault is not included. An estimated calculation value to be a difference of an IDDQ value is calculated between a case when each of the faults is included and a case when the fault is not included. The estimated calculation value is compared with a difference between the measured value and the measured estimation value to decide whether or not the fault candidate is the fault corresponding to a defective portion.

6 Claims, 6 Drawing Sheets

| IDDQ1 INPUT | ID11 | | | ID12 | | | ID13 | ID14 (=0) |
|---|---|---|---|---|---|---|---|---|
| a | 0 | 1 | 1 | 0 | 0 | 1 | 0 | 1 |
| b | 1 | 0 | 1 | 0 | 1 | 0 | 0 | 1 |
| c | 1 | 1 | 0 | 1 | 0 | 0 | 0 | 1 |

| INPUT \ IDDQ2 | ID21 | | | ID22 | | | ID23 | ID24 |
|---|---|---|---|---|---|---|---|---|
| a | 0 | 1 | 1 | 0 | 0 | 1 | 0 | 1 |
| b | 1 | 0 | 1 | 0 | 1 | 0 | 0 | 1 |
| c | 1 | 1 | 0 | 1 | 0 | 0 | 0 | 1 |
| d | 1 | | | 1 | | | 1 | 0 |

APPARATUS FOR ANALYZING FAULT OF SEMICONDUCTOR INTEGRATED CIRCUIT, METHOD FOR THE SAME, AND COMPUTER READABLE MEDIUM FOR THE SAME

CROSS-REFERENCE TO RELATED APPLICATION

This application is based on and claims the benefit of priority from the prior Japanese Patent Application No. 2005-202979, filed on Jul. 12, 2005; the entire contents of which are incorporated herein by reference.

TECHNICAL FIELD

The present invention relates to an apparatus for analyzing fault of semiconductor integrated circuit, a method for the same, and computer readable medium for the same.

BACKGROUND

Conventionally, an IDDQ (IDD Quiescent) test, a variety of IDDQ tests, has been practically used as a testing method which can easily enhance quality of a test in a semiconductor integrated circuit (hereinafter, referred to as "LSI") using a complementary metal-oxide semiconductor (hereinafter, referred to as "CMOS") circuit. In the CMOS circuit in a state in which an external input is decided and an operation is stable, a DC (Direct Current) path is not present. For this reason, only a very minute off-leakage current flows to the CMOS circuit. If a defect causing a current abnormality is present in the LSI using the CMOS circuit, accordingly, the defect can easily be detected. An IDDQ test utilizes the feature.

In a stuck-at fault model to be the easiest fault model, a signal of a defective portion in the LSI is fixed to 1 or 0. In case of the stuck-at fault, when a basic cell for driving a wiring in a defective portion outputs a signal of a reversed logical value to a logical value fixed by a fault to the wiring in the defective portion, an abnormal current flows to the LSI. In a short-circuit fault between wirings which are adjacent to each other (which will be hereinafter referred to as a "bridge fault"), in the case in which a signal of one of the wirings which is short-circuited is driven to "0" and a signal of the other wiring is driven to "1", the abnormal current flows to the LSI.

Recently, some defective portion isolating methods using an IDDQ test have been proposed by setting the stuck-at fault and the bridge fault as targets. A basic defective portion isolating method is as follows. First of all an IDDQ fault simulation (a simulation for obtaining a logical value of a portion corresponding to each fault to decide a detection or no-detection of the fault) is carried out by using logical connection information or adjacent wiring (signal) information of an LSI to be a testing target (hereinafter, referred to as a "target LSI") to obtain detection/no-detection information about the assumed faults on each measuring point of an IDDQ test. The detection/no-detection information is caused to correspond to a result of the IDDQ test of the target LSI, thereby limiting fault candidates of the target LSI sequentially. The "detection/no-detection information" is, hereinafter, information about faults of the LSI which are detected on each measuring point and information about faults of the LSI which are not detected. The "measuring point" implies a time that inputs of the target LSI are set to measure an IDDQ value in the XDDQ test. In general, a plurality of measuring points is set in the IDDQ test.

In the case in which the test result is "pass" on a certain measuring point (the IDDQ value is equal to or smaller than a value decided to be a normal product), a fault candidate is a fault other than that detected on the same measuring point. On the other hand, in the case in which the test result on the certain measuring point is "fail" (the TDDQ value exceeds the value decided to be the normal product), the fault candidate is limited to a fault detected on the same measuring point (the fault candidate is limited to "a set of faults" in consideration of a plurality of faults). By carrying out the above procedure for a plurality of measuring points, the fault candidates are limited and the defective portion is isolated.

In a large scale logic LSI with several million logical gates or more, for example, a large number of faults (fault candidates) are assumed. For this reason, there is a problem in that an enormously long time is required for carrying out a calculation to limit the fault candidates by the above procedure and an excellent limitation to a sufficiently small number of fault candidates cannot be carried out. In order to solve the problem, there has been proposed a method of carrying out a limitation for a stuck-at fault and a bridge fault and solving simultaneous linear equations with a measured value of a IDDQ test set to be an unknown quantity, thereby specifying a plurality of faults (for example, see JP-A-10-19986) By a recent process microfabrication, however, the IDDQ value of the LSI has reached several mA or several hundreds mA in an extreme case, though the IDDQ was equal to or smaller than several μA to approximately 10 μA in an LSI manufactured in a conventional and not fine process. Furthermore, the IDDQ value has a great variation every measuring point, and an accurate judgement as to "pass" and "fail" is hard to perform in the method proposed in JP-A-10-19986, where only one specification value is assigned to each abnormal IDDQ value decided to be defective in the IDDQ test. For this reason, it is difficult to obtain a correct answer in case of the bridge fault in which a plurality of abnormal IDDQ values are present depending on an input state, for example. In the proposed method, therefore, it is hard to limit a defective portion with high precision.

Moreover, the IDDQ value has a characteristic as to be decreased considerably (to be equal to or greater than approximately one digit) by a reduction in a temperature, that is, a reduction to −40 degree from a room temperature, for example. Therefore, it is possible to propose a method of isolating a defective portion based on a result of a measurement at a low temperature. However, some IDDQ abnormalities are not observed at a low temperature even if they are observed at the room temperature, for example. For this reason, the method is not a perfect solution.

SUMMARY

A fault analyzing apparatus of a semiconductor integrated circuit which serves to isolate a defective portion on the semiconductor integrated circuit, comprising (A) a test and detected fault database for storing a test vector of an IDDQ test and detected and undetected faults on each measuring point of the test vector, (B) a fault related information extracting portion for extracting, as fault related information, the faults and information about a circuit for driving the faults based on layout information and logical connection information of the semiconductor integrated circuit, (C) an operation analyzing portion for carrying out an operation analysis of the semiconductor integrated circuit based on the logical connection information, operation information of the driving circuit, the test vector and the fault related information and obtaining a signal value of a portion corresponding to each fault on each measuring point and an input value of the circuit for driving the portion in the case in which the fault does not exist, (D) an IDDQ test result database for storing a pass/fail result on the measuring point in the IDDQ test, a measured value and at least a difference between the measured value on a failed measuring point and a measured estimation value in the case in which the semiconductor integrated circuit does not include a fault, (E) a fault candidate extracting portion for extracting fault candidates from detected faults on each measuring point based on the pass/fail result on the measuring point which is stored in the IDDQ test result database and the detected faults on the measuring point which is stored in the test and detected fault database, (F) a variation database for storing at least a variation corresponding to an input value of an IDDQ value in the case in which a fault is included with respect to the case in which the fault is not included for each circuit for driving the fault candidate or coefficient data constituting an equation for calculating the variation, and (G) a calculating and deciding portion for calculating an estimated calculation value to be a difference of the IDDQ value in the case in which a fault candidate is included with respect to the case in which the fault on the failed measuring point is not included based on an input value of the circuit for driving the fault candidate on the failed measuring point which is calculated by the operation analyzing portion and the variation database, and comparing the estimated calculation value to be the difference with a difference between the measured value on the failed measuring point which is stored in IDDQ test result database and the measured estimation value, thereby deciding whether the fault candidate is the fault corresponding to the defective portion or not.

An automatic fault analyzing method of a semiconductor integrated circuit which serves to isolate a defective portion on the semiconductor integrated circuit, in a fault analyzing apparatus including a fault related information extracting portion, a fault candidate extracting portion, an operation analyzing portion and a calculating and deciding portion, comprising the steps of (A) storing a test vector of an IDDQ test and detected and undetected faults on each measuring point of the test vector in a test and detected fault database, (B) causing the fault related information extracting portion to extract, as fault related information, the faults and information about a circuit for driving the faults based on layout information and logical connection information of the semiconductor integrated circuit, (C) storing, in the IDDO test result database, a pass/fail result on the measuring point in the IDDQ test, a measured value and at least a difference between the measured value on a failed measuring point and a measured estimation value in the case in which the semiconductor integrated circuit does not include a fault, (D) causing the fault candidate extracting portion to extract fault candidates from detected faults on the measuring point based on the pass/fail result on the measuring point which is stored in the IDDQ test result database and the detected faults on the measuring point which is stored in the test and detected fault database, (E) causing the operation analyzing portion to carry out an operation analysis of the semiconductor integrated circuit based on the logical connection information of the semiconductor integrated circuit, operation information of the driving circuit, the test vector and the fault related information and obtaining a signal value of the portion corresponding to each fault on the measuring point and an input value of the circuit for driving the portion in the case in which the fault does not exist, (F) storing, in a variation database, at least a variation corresponding to an input value of an IDDQ value in the case in which a fault is included with respect to the case in which the fault is not included for each circuit for driving the fault candidate or coefficient data constituting an equation for calculating the variation, (G) causing the calculating and deciding portion to calculate an estimated calculation value to be a difference of the IDDQ value in the case in which a fault candidate is included with respect to the case in which the fault on the failed measuring point is not included based on an input value of the circuit for driving the fault candidate on the failed measuring point which is calculated by the operation analyzing portion and the variation database, and (H) causing the calculating and deciding portion to compare the estimated calculation value to be the difference with a difference between the measured value on the failed measuring point which is stored in the IDDQ test result database and the measured estimation value, thereby deciding whether the fault candidate is the fault corresponding to the defective portion or not.

BRIEF DESCRIPTION OF THE DRAWINGS

These and other objects and advantages of this invention will become more fully apparent from the following detailed description taken with the accompanying drawings in which.

DESCRIPTION OF THE EMBODIMENTS

Figure 1:
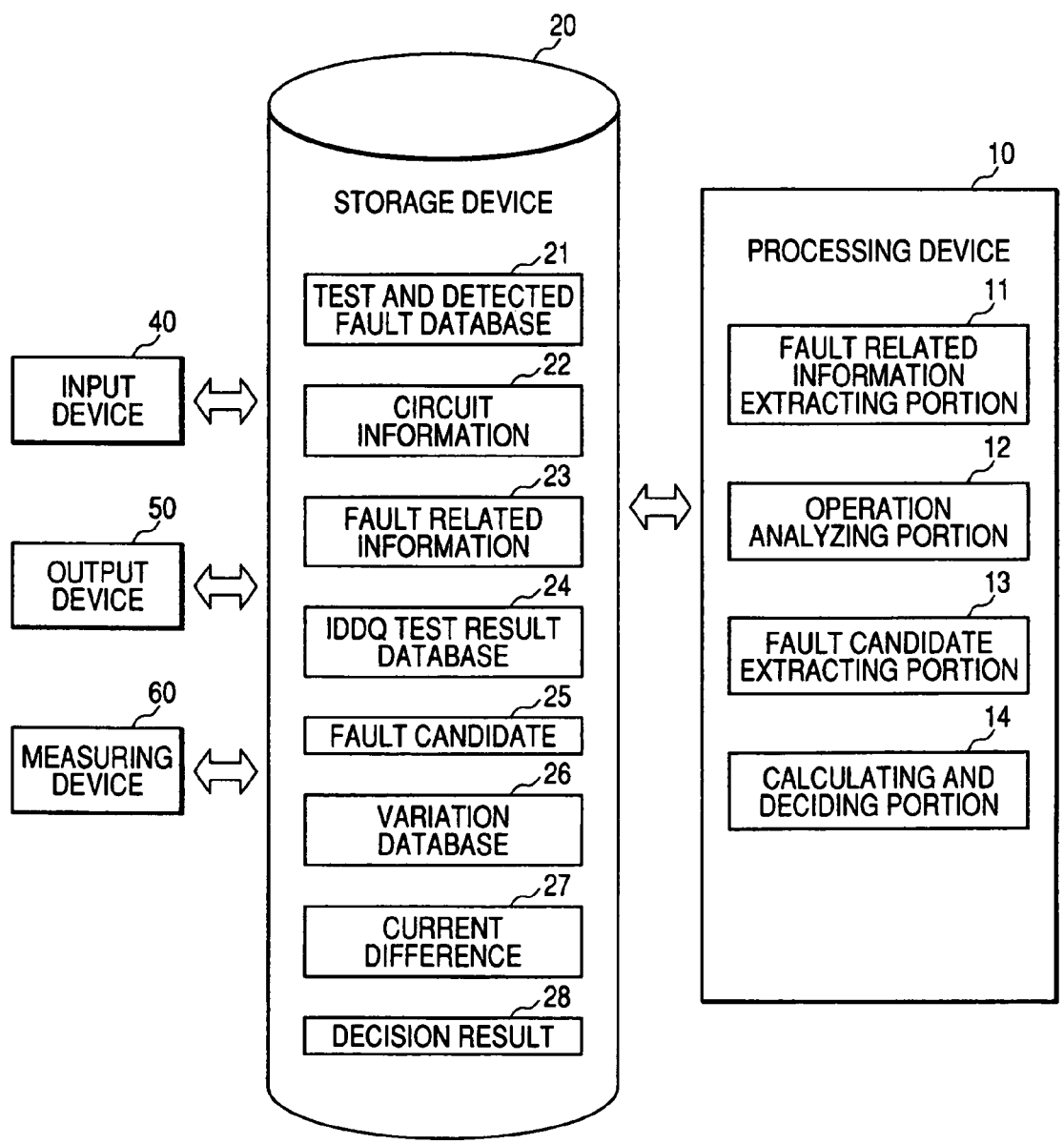
FIG. 1 is a typical diagram showing a structure of a fault analyzing apparatus of a semiconductor integrated circuit according to a first embodiment of the invention.

Next, a first or second embodiment of the invention will be described with reference to the drawings. In the following description of the drawings, the same or similar portions have the same or similar reference numerals. In the following first or second embodiment, moreover, there is illustrated an apparatus and method for specifying the technical thought of the invention, and the technical thought of the invention is not specific to the following structure and arrangement of components. The technical thought of the invention can be variously changed within the claims.

First Embodiment

A fault analyzing apparatus of a semiconductor integrated circuit according to a first embodiment of the invention serves to isolate a defective portion on the semiconductor integrated circuit and, as shown in FIG. 1. The fault analyzing apparatus according to the first embodiment comprises a test/detected fault database 21 for storing a test vector of an IDDQ test and at least detected faults on respective measuring points (measuring times) of the test vector, a fault related information extracting portion 11 for extracting, as fault related information, a fault and information about a circuit for driving the fault (a driving circuit (a basic cell/macro cell) name and an input/output signal name) based on layout information and logical connection information of the semiconductor integrated circuit, an operation analyzing portion 12 for analyzing the operation of the semiconductor integrated circuit based on the logical connection information, the operation information of the driving circuit, the test vector and the fault related information and obtaining a signal value of a portion corresponding to each fault on each measuring point and an input value of a circuit for driving each failure portion in the case in which a fault is not included, an IDDQ test result database 24 for storing a pass/fail result on each measuring point in the IDDQ test, a measured value, and at least a difference between a measured value on a failed measuring point and a measured estimation value in the case in which the semiconductor integrated circuit does not include a fault (regarded as "pass") a fault candidate extracting portion 13 for extracting fault candidates from detected faults on each measuring point based on the pass/fail result on each measuring point which is stored in the IDDQ test result database 24 and detected faults on each measuring point which is stored in the test and detected fault database 21, a variation database 26 for storing at least a variation corresponding to an input value of an IDDQ value in the case in which a fault is included with respect to the case in which the fault is not included for each circuit for driving the fault candidate or coefficient data constituting an equation for calculating the variation, a calculating and deciding portion 14 for calculating an estimated calculation value to be a difference in the IDDQ value in the case in which a fault candidate is included with respect to the case in which the fault is not included on each failed measuring point based on information about the input value of the circuit for driving a fault candidate on a failed measuring point which is calculated by the operation analyzing portion 12 and the variation stored in the variation database 26 and comparing the estimated calculation value to be the difference with a difference between the measured value on each failed measuring point which is stored in the IDDQ test result database 24 and the measured estimation value, thereby deciding whether the fault candidate is the fault corresponding to the defective portion or not.

The fault related information extracting portion 11, the operation analyzing portion 12, the fault candidate extracting portion 13 and the calculating and deciding portion 14 are included in a processing device 10. The fault analyzing apparatus shown in FIG. 1 comprises a storage device 20, an input device 40, an output device 50 and a measuring device 60. The storage device 20 maintains a proper storage region and stores the test and detected fault database 21, circuit information 22, fault related information 23, the IDDQ test result database 24, a fault candidate 25 and the variation database 26, a current difference 27 and a decision result 28.

The test and detected fault database 21 stores detected (and undetected) faults on each measuring point (measuring time) of a test vector of the IDDQ test. Such data can be generally acquired by a simulation for IDDQ faults or an ATPG for IDDQ faults for a semiconductor integrated circuit which is described by the logical connection information, and basic cell and the macro cell.

The circuit information 22 stores circuit information such as logic connection information and layout information of a semiconductor integrated circuit to be a target.

The fault related information 23 stores the information (the driving circuit (the basic cell/macro cell) name and the input/output signal name) which are related to a fault extracted by the fault related information extracting portion 11 based on the circuit information 22 of the target semiconductor integrated circuit and a circuit for driving a signal related to the same fault.

The IDDQ test result database 24 stores a pass/fail result on each measuring point in the IDDQ test, a measured value, and at least a difference between a measured value on a failed measuring point and a measured estimation value in the case in which the semiconductor integrated circuit does not include the fault (regarded as "pass"). The measured estimation value in the case in which the fault is not included is acquired from a result obtained by carrying out the IDDQ test over other samples of the semiconductor integrated circuit which are the same as the fault analyzing target samples. For example, it is possible to employ a method disclosed in JP-A-2005-134255 ("an IDDQ testing method in an LSX having a large off-leakage current").

The variation database 26 at least stores a variation corresponding to the input value of the IDDQ value or coefficient data constituting an equation for calculating the variation in the case in which each fault (candidate) is included with respect to the case in which the fault is riot included for each circuit for driving the fault. For example, each variation of an IDDQ for a value from the case in which any fault is not included to the case in which each fault is electrically connected to any of a power wiring, a GND and an adjacent wiring is stored in the variation database 26. The IDDQ value in the case in which the fault is present can be calculated by executing a circuit simulation such as SPICE for a circuit created on an assumption of the fault, for example. Description will be given to the variation of the IDDQ which is stored in the variation database 26.

Figures 2, 3:
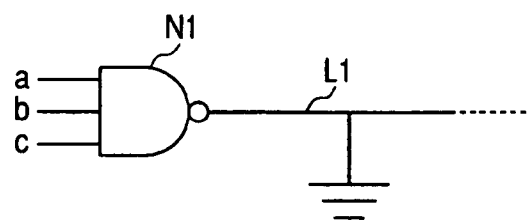
FIG. 2 is a typical diagram showing an example of a fault (defect) to be analyzed by the fault analyzing apparatus of the semiconductor integrated circuit according to the first embodiment.
FIG. 3 is a table showing an example of an IDDQ value in a fault illustrated in FIG. 2.

FIG. 2 shows an example of the fault. FIG. 2 shows a fault caused by a short between a wiring L1 from an output terminal of an NAND circuit N1 and a GND. In the case in which the fault shown in FIG. 2 exists, an IDDQ value IDDQ1 depends on a driving strength of the wiring L1 by the NAND circuit N1, and the driving strength depends on a gate width of an element set into an ON state in an inner part corresponding to an input value to the NAND circuit N1. Accordingly, the IDDQ value IDDQ1 depends on an input value an input condition) of the NAND circuit N1.

FIG. 3 shows an example of the IDDQ value IDDQ1 for each input value of the NAND circuit N1. An IDDQ value $Id_{11}$ shown in FIG. 3 is the IDDQ value IDDQ1 in the case in which one of inputs a to c of the NAND circuit N1 is "0". An IDDQ value $Id_{12}$ is the IDDQ value IDDQ1 in the case in which two of the inputs a to c of the NAND circuit N1 is "0". An IDDQ value $Id_{13}$ is the IDDQ value IDDQ1 in the case in which all of the inputs a to c of the NAND circuit N1 is "0". An IDDQ value $Id_{14}$ is the IDDQ value IDDQ1 in the case in which all of the inputs a to c of the NAND circuit N1 is "1". Accordingly, $Id_{14}=0$ is set. In general, $Id_{13}>Id_{12}>Id_{11}$ is set.

When a value in the case in which the wiring L1 is not connected to the GND, that is, the wiring L1 is fault-free is set to be a IDDQ value $Id_{10}$, variations in the IDDQ values $Id_{11}$, $Id_{12}$ and $Id_{13}$ for the IDDQ value $Id_{10}$ are stored in the variation database 26 together with the information about the detected fault and the input condition, respectively. In a scale of the basic cell such as the NAND circuit, an IDDQ value in the normal case is extremely small. Even if a value in the case in which the fault is present is directly stored by neglecting the value of $Id_{10}$, there is no practical hindrance (which will not be specifically described below).

As for storing variation data, the IDDQ value are described in general using Boolean expression as follows;

$$IDDQ(NAND,3,\text{stuck-}at0)=Id_{11}*(\sim x1*x2*x3)+Id_{12}*(\sim x1*\sim x2*x3)+Id_{13}*(\sim x1*\sim x2*\sim x3*)$$

($X=(x1,x2,x3)$ is a,b,c. $\sim x1$=revered logic of x1);

As seen from the above, using an adequate equation, it is possible to store IDDQ values $Id_{11}$, $Id_{12}$, $Id_{13}$ as coefficient data in a variation database 26.

Figures 4, 5:
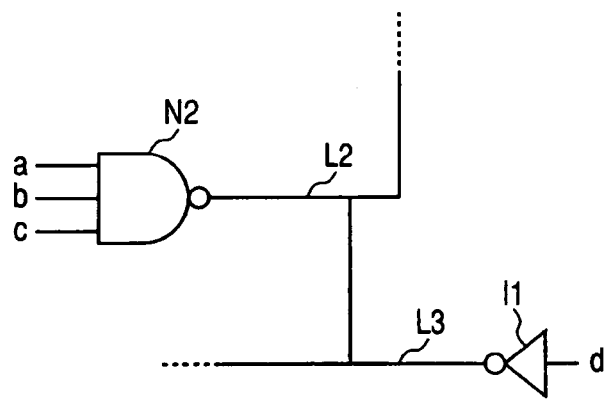
FIG. 4 is a typical diagram showing another example of a fault (defect) to be analyzed by the fault analyzing apparatus of the semiconductor integrated circuit according to the first embodiment.
FIG. 5 is a table showing an example of an IDDQ value in a fault illustrated in FIG. 4.

FIG. 4 shows another example of the fault. FIG. 4 shows a fault in which a wiring L2 to be connected to an output terminal of an NAND circuit N2 is short-circuited with a wiring L3 to be connected to an output terminal of an inverter circuit I1. In the case in which the fault shown in FIG. 4 exists, an IDDQ value IDDQ2 flowing to an LSI depends on a driving strength of the NAND circuit N2 for driving the wiring L2 and a driving strength of the inverter circuit I1 for driving the wiring L3, and the driving strength depends on a gate width of an element set into an ON state in an inner part corresponding to input values to these circuits. Accordingly, the IDDQ value IDDQ2 depends on an input value of the NAND circuit N2 and that of the inverter circuit I1.

FIG. 5 shows an example of the IDDQ value IDDQ2 for each input value of the RAND circuit N2 and that of the inverter circuit I1. An IDDQ value $Id_{21}$ shown in FIG. 5 indicates the IDDQ value IDDQ2 in the case in which one of inputs a to c in the NAND circuit N2 is "0" and an input d of the inverter circuit I1 is "1". An IDDQ value $Id_{22}$ indicates the IDDQ value IDDQ2 in the case in which two of the inputs a to c in the NAND circuit N2 are "0" and the input d of the inverter circuit I1 is "1". A IDDQ value $Id_{23}$ indicates the IDDQ value IDDQ2 in the case in which all of the inputs a to c in the NAND circuit N2 are "0" and the input d of the inverter circuit I1 is "1". An IDDQ value $Id_{24}$ indicates the IDDQ value IDDQ2 in the case in which all of the inputs a to c in the NAND circuit N2 are "1" and the input d of the inverter circuit I1 is "0". In general, $Id_{23}>Id_{22}>Id_{21}>Id_{24}$ are set and the IDDQ value IDDQ2=0 is set in case of a combination of the other input values. The values (of a change in) the IDDQ values $Id_{21}$, $Id_{22}$, $Id_{23}$ and $Id_{24}$ are stored in the variation database 26 together with the information about the detected fault and the input value including the case of the IDDQ value IDDQ2=0.

Referring to a stuck-at fault assumed for the wiring L1 shown in FIG. 2, specifically, an instance name of the NAND circuit N1 for driving the wiring L1 (an identification name in the semiconductor integrated circuit to be the target) and input/output terminal names correspond to the fault related information 23 shown in FIG. 1, for example. Referring to a short-circuit fault (bridge fault) of the wiring L2 and the wiring L3 shown in FIG. 4, moreover, information about the NAND circuit N2 for driving the wiring L2, information about the wiring L3 which is adjacent to the wiring L2 and information of the inverter circuit I1 for driving the wiring L3 are extracted as the fault related information 23.

The fault candidates extracted by the fault candidate extracting portion 13 are stored in the fault candidate 25 of the storage device 20. The current difference 27 stores an estimated calculation value to be a difference of an IDDQ value in the case in which the fault candidate is included with respect to the case in which the fault on each failed measuring point is not included based on the information about an input value of a circuit for driving the fault candidate on each failed measuring point which is calculated by the operation analyzing portion 12 and the variation stored in the variation database 26 which is calculated by the calculating and deciding portion 14. The calculating and deciding portion 14 compares the estimated calculation value of the difference with a difference between a measured value on each failed measuring point stored in the IDDQ test result database 24 and a measured estimation value, and a result obtained by deciding whether the fault candidate is the fault corresponding to the defective portion or not is stored in the decision result 28.

The input device 40 is constituted by a keyboard, a mouse, a write pen or a flexible disk device. By the input device 40, a person for executing a fault analysis can specify input/output data and can set a fault analysis condition. By the input device 40, furthermore, it is also possible to set the configuration of the output data, and furthermore, to input an instruction for executing and stopping the fault analysis.

For the output device 50, moreover, it is possible to use a display and a printer for displaying a fault analysis result or a recording device for storing the fault analysis result in a computer readable recording medium. The "computer readable recording medium" implies a medium capable of recording electronic data, for example, an external memory device of a computer, a semiconductor memory, a magnetic disk (including a flexible disk), an optical disk (including a CD-R), an optical magnetic disk and a magnetic tape (including a cassette tape).

The measuring device 60 is constituted by a power supply such as a constant current source or a constant voltage source which is not shown, a measuring apparatus such as an ammeter or a voltmeter, tester, or a prober. A test vector and a test execution condition which are required for an IDDQ test of the semiconductor integrated circuit to be the target are read from the test and detected fault database 21 to the measuring device 60, and the IDDQ test of the semiconductor integrated circuit to be the target is carried out.

With reference to a flowchart of FIG. 6, description will be given to a method of analyzing a fault of a semiconductor integrated circuit to be a target by the fault analyzing apparatus shown in FIG. 1 (which will be hereinafter referred to as a target LSI for simplicity).

(A) At Step S10, a test vector of the IDDQ test of the target LSI and detected (and undetected) faults on respective measuring points (measuring times) of the test vector are stored in the test and detected fault database 21 through the input device 40 shown in FIG. 1. At Step S20, moreover, the circuit information of the target LSI is stored in the circuit information (storage region) 22.

(B) At Step S30, the fault related information extracting portion 11 reads the circuit information of the target LSI from the circuit information (storage region) 22 and extracts information about a fault and a circuit for driving the fault (a driving circuit (a basic cell/macro cell) name and an input/output signal name) as fault related information. The fault related information thus extracted is stored in the fault related information (storage region) 23.

(C) At Step S40, a pass/fail result on each measuring point in the IDDQ test of the target LSI which is carried out by using the measuring device 60, a measured value, and at least a difference between a measured value on a failed measuring point and a measured estimation value in the case in which the target LSI does not include a fault (regarded as "pass") are stored in the IDDQ test result database 24. At Step S50, subsequently, the fault candidate extracting portion 13 extracts fault candidates from the detected faults on each measuring point based on the pass/fail result on each measuring point which is stored in the IDDQ test result database 24 and detected faults on each measuring point which is stored in the test and detected fault database 21. The fault candidates thus extracted are stored in the fault candidate (storage region) 25, (D) At Step S60, the operation analyzing portion 12 analyzes the operation of the target LSI based on the logical connection information of the target LSI, the operation information of the driving circuit, the test vector and the fault related information 23, and obtains a signal value in each portion related to a fault on each measuring point and an input value of a circuit for driving the portion in the case in which a fault is not included.

(E) At Step S70, at least a variation corresponding to an input value of a IDDQ value or coefficient data constituting an equation for calculating the variation in the case in which a fault is included with respect to the case in which the fault is not included for each circuit for driving the fault candidate is/are stored in the variation database 26.

(F) At Step S80, the calculating and deciding portion 14 calculates an estimated calculation value $\Delta Idc$ to be a difference of an IDDQ value in the case in which a fault candidate is included with respect to the case in which a fault on each failed measuring point is not included based on an input value of a circuit for driving the fault candidate on each failed measuring point which is calculated by the operation analyzing portion 12 and information about the variation stored in the variation database 26. The estimated calculation value $\Delta Idc$ to be the calculated difference is stored in the current difference (storage region) 27. Moreover, a difference $\Delta Idm$ between the measured value on each failed measuring point which is stored in the IDDQ test result database 24 and the measured estimation value is calculated. The difference $\Delta Idm$ is also stored in the current difference (storage region) 27.

(G) At Step S90, the calculating and deciding portion 14 reads the estimated calculation value $\Delta Idc$ to be the difference and the difference $\Delta Idm$ between the measured value on each failed measuring point and the measured estimation value from the current difference (storage region) 27. The calculating and deciding portion 14 compares the estimated calculation value $\Delta Idc$ to be the difference with the difference $\Delta Idm$ and decides whether the fault candidate is the fault corresponding to a defective portion or not. More specifically, the decision is carried out in the following manner, for example. First of all, a multiplicity of the fault to be considered is preset. When the multiplicity is increased, generally, the number to be considered increases exponentially. For this reason, it is desirable that the multiplicity of the fault should be set to be approximately 2 to 4, and furthermore, it can be expected that the fault can be accurately isolated with sufficiently high precision at a multiplicity to this extent. The multiplicity can be regulated to be higher if a manufacturing process is unstable and a yield is low, and to be lower if the manufacturing process is stable and the yield is high, and is preferably decided properly. In the case in which the differences $\Delta Idm$ on the respective measuring points are compared with the estimated calculation values $\Delta Idc$ to be the differences of the respective fault candidates on the assumption of a multiplicity=1 (a single fault) and all of them are coincident with each other, next, it is decided that the fault candidate is a fault of the target LSI. For example, in the case in which a fault in which the wiring L1 and the GND shown in FIG. 2 are short-circuited is the fault candidate, the estimated calculation value $\Delta Idc$ to be the difference is determined by any of the variations of the IDDQ values $Id_{11}$, $Id_{12}$ and $Id_{13}$ for the IDDQ value $Id_{10}$ based on the input value (condition) of the NAND circuit N1 on each measuring point where the fault candidate is detected. At this time, even if the difference $\Delta Idm$ is slightly different from the estimated calculation value $\Delta Idc$ to be the difference on each measuring point in consideration of a manufacturing variation, it is decided that they are coincident with each other if a ratio has a value of approximately one and is almost constant. In case of the assumption of a single fault, it is possible to carry out a previous isolation to the smaller number of fault candidates by adding the condition of "detected" in a "fail" measuring point in the fault candidate-extracting portion. Consequently, it is possible to enhance the efficiency of a fault analysis. Before an individual comparison and decision, moreover, a type of the difference $\Delta Idm$ corresponding to a measuring point is compared with a type of a current value which can be generated by a circuit for driving each fault candidate. If the latter is less than the former, the fault candidate can be decided to be no fault of the target LSI and can also be excluded. For example, if $\Delta Idm$ to be the difference which is a result of the measurement has three types of values, the stuck-at fault to be driven by an inverter circuit or a buffer circuit (there are two types of estimated calculation values $\Delta Idc$ to be the difference) is excluded from the fault candidate. Consequently, the fault candidate is reliably reduced and the limiting efficiency of the fault can be enhanced. In the case in which a maximum value $\Delta Idc\_max$ of $\Delta Idc$ to be the difference of each fault candidate with respect to a minimum value $\Delta Idm\_min$ of $\Delta Idm$ to be the difference on a plurality of measuring points is set to be $\Delta Idc\_max<\Delta Idm\_min$ in consideration of a variation in manufacture, moreover, the fault candidate is excluded. A method of limiting the fault candidate depending on the possible type and allowable range of the values of the difference $\Delta Idm$ and the estimated calculation value $\Delta Idc$ to be the difference can be effectively utilized also in case of a multiple fault.

In the case in which the decision is executed for all of the fault candidates and a pertinent fault candidate cannot be found, the differences of $\Delta Idm$ on the respective measuring points are compared with the sum of the estimated calculation value $\Delta Idc$ to be the difference obtained by a set of two optional fault candidates on the assumption of a multiplicity=2 (a double fault) and all of them are coincident with each other, the set of two fault candidates is decided to be a set of faults of the target LSI. It is to be noted that the case in which the estimated calculation value to be the difference of one of the fault candidates $\Delta Idc$ is equal to zero should also be considered in each set of fault candidates. In the case in which the set of faults cannot be determined, subsequently, a comparison and decision is increased up to a set of fault candidates for a multiplicity which is preset and a set of faults which is coincident with the result of the measurement is retrieved. In the case in which the determination cannot be carried out at a predetermined multiplicity, an abnormal end is set. A main possibility is that the fault might be caused at a higher multiplicity than a supposed multiplicity or a defect might be generated in a different mode from a fault model which is assumed. On the other hand, a plurality of fault candidates (sets) are finally left in some cases. In these cases, it is desirable to separately estimate the degrees of respective possibilities so as to be reference for a subsequent physical fault analysis (an analysis for exposing each layer constituting the target LSI with chemicals and directly observing the same layer by means of an optical electron microscope, for example).

Reference can be made to the fault candidate stored in the decision result (storage region) 28 from an outside through the output device 50. By investigating the target LSI based on a candidate portion, it is possible to analyze the cause of a fault.

As described above, in the fault analyzing apparatus according to the first embodiment of the invention, the difference between the IDDQ value measured in the target LSI and the value in the case in which the failure portion is not included is used. Also in an IDDQ test for an LSI having a great IDDQ value, therefore, it is possible to detect an abnormal IDDQ value with high precision, thereby limiting a failure portion. In other words, it is possible to implement a fault analysis with high precision by the IDDQ test for an LSI having a large circuit scale and a large off-leakage current. Moreover, the fault candidates are extracted for each measuring point. Therefore, it is possible to isolate a plurality of defective portions in a plurality of places on the target LSI, respectively.

Figure 6:
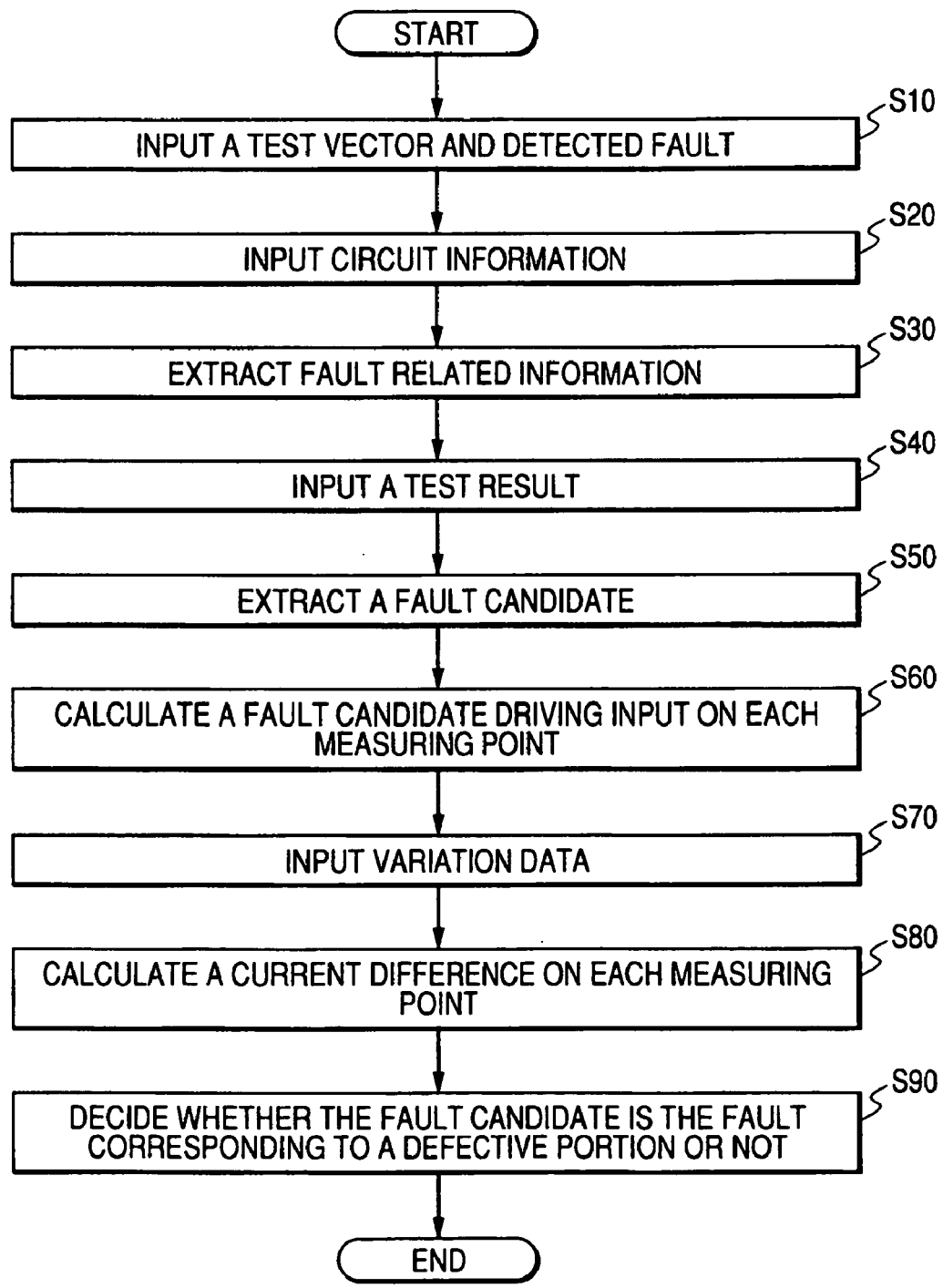
FIG. 6 is a flowchart for explaining a fault analyzing method of the semiconductor integrated circuit according to the first embodiment.

A serial fault analyzing operation shown in FIG. 6 can be executed by controlling the fault analyzing apparatus shown in FIG. 1 in accordance with a program in an equivalent algorithm to that in FIG. 6. It is preferable that the program should be stored in the storage device 20 constituting the fault analyzing apparatus shown in FIG. 1. By retaining the program in a computer readable recording medium and causing the storage device 20 shown in FIG. 1 to read the recording medium, moreover, it is possible to execute a serial mask data creating operation according to the invention.

Second Embodiment

Figure 7:
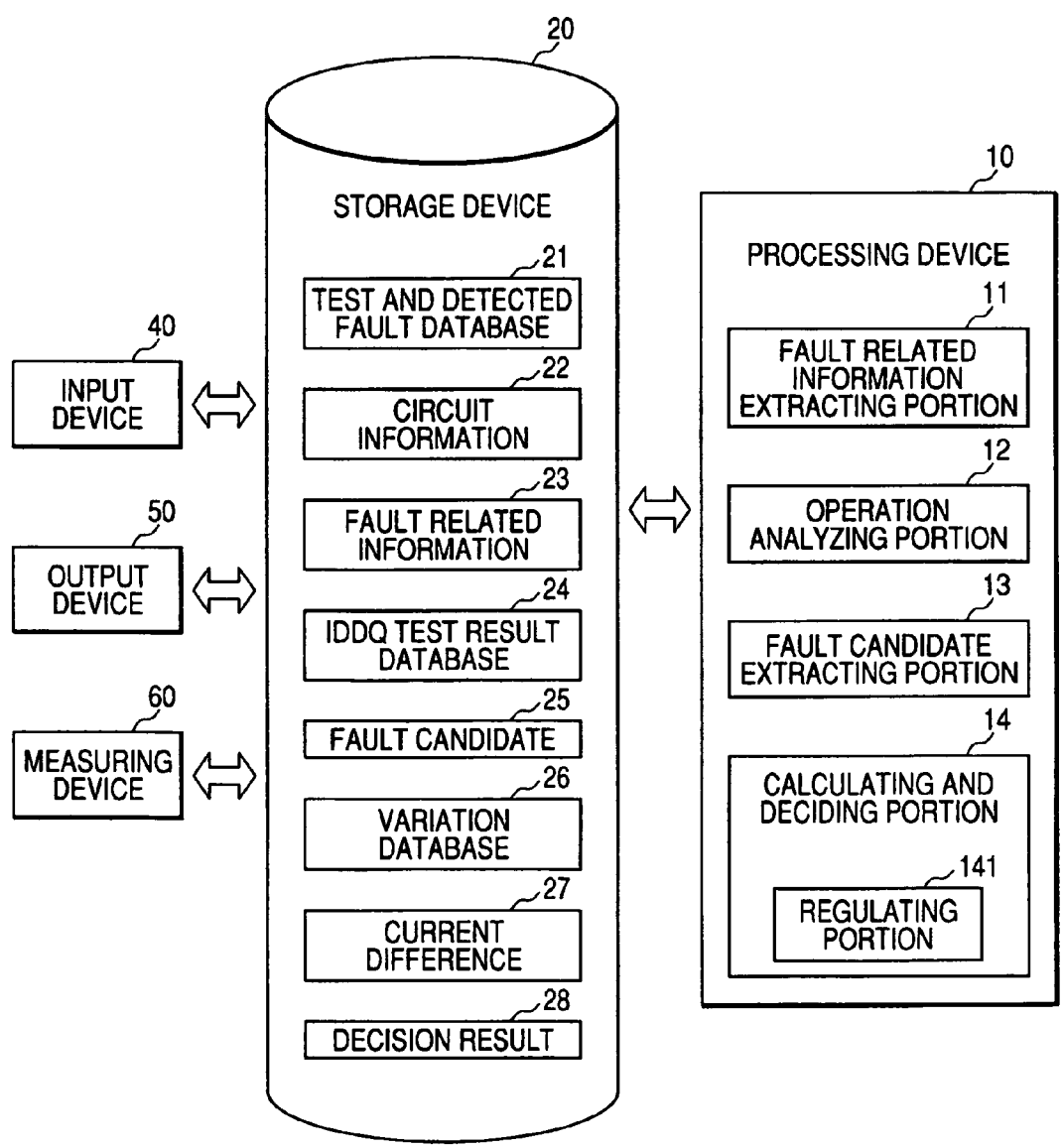
FIG. 7 is a typical diagram showing a structure of a fault analyzing apparatus of a semiconductor integrated circuit according to a second embodiment of the invention.

A fault analyzing apparatus of a semiconductor integrated circuit according to a second embodiment of the invention is different from that in FIG. 1 in that the calculating and deciding portion 14 includes a regulating portion 141 as shown in FIG. 7. The other structures are the same as those in the first embodiment shown in FIG. 1.

Figure 8:
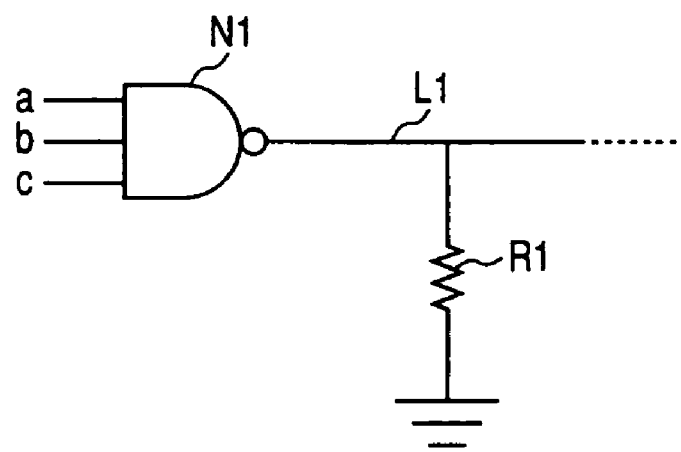
FIG. 8 is a typical diagram showing an example of a fault (defect) to be analyzed by the fault analyzing apparatus of the semiconductor integrated circuit according to the second embodiment.
Figure 9:
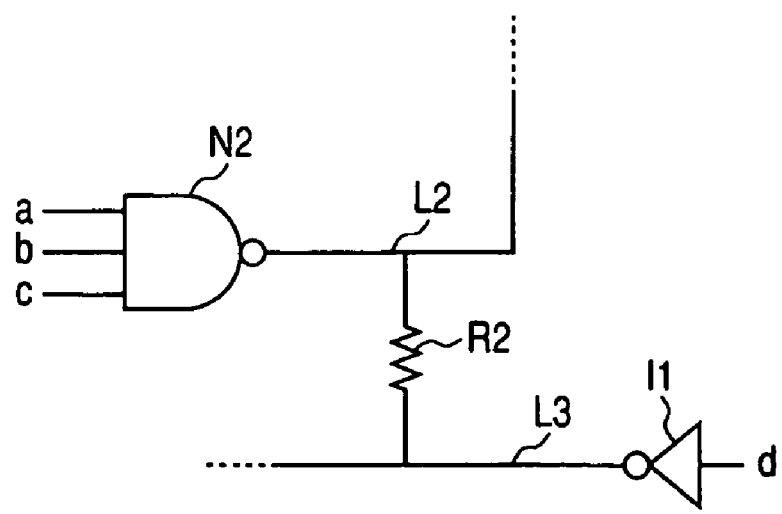
FIG. 9 is a typical diagram showing another example of a fault (defect) to be analyzed by the fault analyzing apparatus of the semiconductor integrated circuit according to the second embodiment.

In the first embodiment, the description has been given to the example of the fault in which the wiring L1 and the GND shown in FIG. 2 are short-circuited. For example, however, there is caused a fault in which a wiring L1 is connected to a GND through a resistor R1 in some cases as shown in FIG. 8. In some cases, alternatively, there is generated a fault in which a wiring L2 and awiringL3 are connected through a resistor R2 as shown in FIG. 9. In case of the fault shown in FIG. 8 or 9, it is possible to decide whether the wiring L1 is a defective portion or not based on a difference between an estimated calculation value $\Delta Idc$ to be a difference regulated by setting a resistance value of the resistor R1 or the resistor R2 as a parameter and a difference $\Delta Idm$, or a ratio.

For example, the regulating portion 141 shown in FIG. 7 changes the resistance value of the resistor R1 shown in FIG. 8 to vary a fault state of the wiring L1 to be a fault candidate, thereby regulating the estimated calculation value $\Delta Idc$ to be the difference. For instance, the regulating portion 141 multiplies the estimated calculation value $\Delta Idc$ to be a difference stored in a variation database 26 by a regulation coefficient set in consideration of an influence on an IDDQ of the resistance value of the resistor R1. Alternatively, a coefficient of a calculating equation for calculating the estimated calculation value $\Delta Idc$ to be the difference including the regulation coefficient is stored in the variation database 26, and the regulating portion 141 may read these coefficients to calculate the estimated calculation value $\Delta Idc$ to be the difference which is regulated. As a result, the estimated calculation value $\Delta Idc$ to be the difference of each fault candidate on each measuring point is regulated. In the case in which the wiring L1 is electrically connected to the GND through the resistor R1, the difference $\Delta Idm$ is generally smaller when the resistance R1 is higher. The calculating and deciding portion 14 decides whether a fault candidate is a fault corresponding to a defective portion or not based on the difference between the estimated calculation value $\Delta Idc$ to be the regulated difference and the difference of $\Delta Idm$. The regulation coefficient which is calculated may be stored in a storage device 20 shown in FIG. 7. The other portions are substantially the same as those in the first embodiment and repetitive description will be omitted.

According to the fault analyzing apparatus of the semiconductor integrated circuit in accordance with the second embodiment of the invention, it is also possible to analyze a fault which is caused by electrically connecting a failure portion to a GND, a power wiring or an adjacent wiring through a resistor.

Other Embodiments

While the invention has been described above with reference to the first or second embodiment, it is to be understood that the statement and drawings constituting a part of the disclosure do not restrict the invention. From the disclosure, various alternative embodiments, examples and application techniques are apparent to the skilled in the art.

For example, in the case in which an IDDQ test was carried out for the same type of LSIs, information about a detecting portion has already been stored in a test and detected fault database 21, and furthermore, fault related information has already been extracted and stored in fault related information (storage region) 23. By using these stored information, the Steps 510 to S30 shown in FIG. 6 can be omitted. While the description has been given to the example in which the variation is prestored in the variation database 26 in the first or second embodiment, it is also possible to calculate a variation of an IDDQ in each fault candidate every measuring point.

According to the above-embodiments, it is possible to provide a fault analyzing apparatus and a fault analyzing method which can isolate a defective portion of a semiconductor integrated circuit with high precision based on a result of an IDDQ test.

Thus, it is a matter of course that the invention includes various embodiments which are not described. Accordingly, the technical range of the invention is determined by only the specific matters of the invention related to the claims which are proper for the description.

What is claimed is:

1. A fault analyzing apparatus of a semiconductor integrated circuit comprising:

a test and detected fault database storing a test vector of an IDDQ test and detected and undetected faults on each measuring point of the test vector;

a fault related information extracting portion extracting, as fault related information, a fault and information about a driving circuit of the fault based on layout information of the semiconductor integrated circuit and logical connection information of the semiconductor integrated circuit;

an operation analyzing portion analyzing an operation of the semiconductor integrated circuit based on the logical connection information, operation information of the driving circuit, the test vector and the fault related information and obtaining a signal value of a portion corresponding to each fault on each measuring point and an input value of the driving circuit in case that the fault does not exists;

an IDDQ test result database storing a pass/fail result on the measuring point in the IDDQ test, a measured value and at least a difference between the measured value on a failed measuring point and a measured estimation value in a case that the semiconductor integrated circuit does not include the fault;

a fault candidate extracting portion extracting fault candidates from detected faults on each measuring point based on the pass/fail result on the measuring point which is stored in the IDDQ test result database and the detected fault on the measuring point which is stored in the test and detected fault database;

a variation database storing at least a variation corresponding to an input value of an IDDQ value in case that a fault is included with respect to a case in which the fault is not included for each circuit for driving the fault candidate or coefficient data constituting an equation for calculating the variation; and a calculating and deciding portion calculating an estimated calculation value to be a difference of the IDDQ value in a case that a fault candidate is included with respect to the case that the fault on the failed measuring point is not included based on an input value of the circuit for driving the fault candidate on the failed measuring point which is calculated by the operation analyzing portion and the variation database, and comparing the estimated calculation value to be the difference with a difference between the measured value on the failed measuring point which is stored in the IDDQ test result database and the measured estimation value, thereby deciding whether the fault candidate is the fault corresponding to the defective portion or not.

2. The fault analyzing apparatus of the semiconductor integrated circuit according to claim 1, wherein the calculating and deciding portion includes a regulating portion changing a fault state of the fault candidate, thereby regulating the variation.

3. The fault analyzing apparatus of the semiconductor integrated circuit according to claim 1, wherein the calculating and deciding portion compares a type of a current difference of the IDDQ test result with a type of a variation which can be taken by the fault candidate and excluding the fault candidate from fault candidates in a case that a number of the types of the variation which can be taken by the fault candidate is smaller than that of the types of the current difference of the IDDQ test result.

4. An automatic fault analyzing method of a semiconductor integrated circuit comprising:

storing a test vector of an IDDQ test and detected and undetected faults on each measuring point of the test vector;

extracting, as fault related information, a fault and information about a driving circuit of the fault based on layout information of the semiconductor integrated circuit and logical connection information of the semiconductor integrated circuit;

storing a pass/fail result on the measuring point in the IDDQ test, a measured value and at least a difference between the measured value on a failed measuring point and a measured estimation value in case that the semiconductor integrated circuit does not include a fault;

extracting fault candidates from the detected faults on the measuring point based on the pass/fail result on the measuring point and the detected failure portion on the measuring point;

analyzing an operation of the semiconductor integrated circuit based on the logical connection information of the semiconductor integrated circuit, operation information of the driving circuit, the test vector and the fault related information;

obtaining a signal value of the portion corresponding to the faults on the measuring point and an input value of the driving circuit in case that a fault is not included;

storing in a database at least a variation corresponding to an input value of an IDDQ value in case that a fault is included with respect to a case that the fault is not included for each driving circuit of the fault candidate or coefficient data constituting an equation for calculating the variation;

calculating an estimated calculation value to be a difference of the IDDQ value in case that a fault candidate is included with respect to the case that the fault on the failed measuring point is not included based on an input value of the driving circuit of the fault candidate on the failed measuring point and the variation database, and comparing the estimated calculation value to be the difference with a difference between the measured value on the failed measuring point and the measured estimation value, and deciding whether the fault candidate is the fault corresponding to a defective portion or not, resulting in an effective reduction of a number of the fault candidates.

5. The automatic fault analyzing method according to claim 4, further comprising:

changing a fault state of the fault candidate; and regulating the variation.

6. A storage medium readable by a computer, the storage medium storing a program of instructions executable by the computer to perform a function for automatically analyzing a fault of semiconductor integrated circuit, the fUnction, comprising:

storing a test vector of an IDDQ test and detected and undetected faults on each measuring point of the test vector;

extracting, as fault related information, a fault and information about a driving circuit of the fault based on layout information of the semiconductor integrated circuit and logical connection information of the semiconductor integrated circuit;

storing a pass/fail result on the measuring point in the IDDQ test, a measured value and at least a difference between the measured value on a failed measuring point and a measured estimation value in case that the semiconductor integrated circuit does not include a fault;

extracting a fault candidate from detected faults on the measuring point based on the pass/fail result on the measuring point and the detected faults on the measuring point;

analyzing an operation of the semiconductor integrated circuit based on the logical connection information of the semiconductor integrated circuit, operation information of the driving circuit, the test vector and the fault related information;

obtaining a signal value of the portion corresponding to the fault on the measuring point and an input value of the driving circuit in case that the fault is not included;

storing in a database at least a variation corresponding to an input value of an IDDQ value in case that a fault is included with respect to a case that the fault is not included for each driving circuit of the fault candidate or coefficient data constituting an equation for calculating the variation;

calculating an estimated calculation value to be a difference of the IDDQ value in case that a fault candidate is included with respect to the case that the fault on the failed measuring point is not included based on an input value of the driving circuit of the fault candidate on the failed measuring point and the variation database, and comparing the estimated calculation value to be the difference with a difference between the measured value on the failed measuring point and the measured estimation value, and deciding whether the fault candidate is the fault corresponding to the defective portion or not, resulting in an effective reduction of a number of the fault candidates.

* * * * *

UNITED STATES PATENT AND TRADEMARK OFFICE
CERTIFICATE OF CORRECTION

| | |
|---|---|
| PATENT NO. | : 7,283,918 B2 |
| APPLICATION NO. | : 11/484857 |
| DATED | : October 16, 2007 |
| INVENTOR(S) | : Yasuyuki Nozuyama |

Page 1 of 1

It is certified that error appears in the above-identified patent and that said Letters Patent is hereby corrected as shown below:

In Column 14, Claim 6, Line 55:
 Please delete "fUnction" and insert --function--.

Signed and Sealed this

Twenty-sixth Day of May, 2009

JOHN DOLL
*Acting Director of the United States Patent and Trademark Office*